United States Patent
Joshi et al.

(10) Patent No.: US 6,615,910 B1
(45) Date of Patent: Sep. 9, 2003

(54) ADVANCED AIR COOLED HEAT SINK

(75) Inventors: Shrikant Mukund Joshi, Williamsville, NY (US); Mohinder Singh Bhatti, Amherst, NY (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/078,942

(22) Filed: Feb. 20, 2002

(51) Int. Cl.[7] .............................. F28F 7/00; H05K 7/20; H01L 23/34
(52) U.S. Cl. ................. 165/80.3; 165/185; 361/690; 361/704; 257/722
(58) Field of Search ................... 165/80.3, 185; 361/704, 697, 710, 690; 174/16.3; 257/722

(56) References Cited

U.S. PATENT DOCUMENTS

| | | | | |
|---|---|---|---|---|
| 5,653,285 A | * | 8/1997 | Lee | 165/185 |
| 5,903,073 A | * | 5/1999 | Mukai | 310/64 |
| 6,263,955 B1 | * | 7/2001 | Azar | 165/80.3 |
| 6,507,494 B1 | * | 1/2003 | Hutchison et al. | 361/704 |

FOREIGN PATENT DOCUMENTS

| | | | | |
|---|---|---|---|---|
| EP | 623952 A1 | * | 11/1994 | 165/185 |
| EP | 1081760 A2 | * | 7/2001 | |
| EP | 1117284 A2 | * | 7/2001 | |
| JP | 362056788 A | * | 3/1987 | |

* cited by examiner

Primary Examiner—Henry Bennett
Assistant Examiner—Tho V. Duong
(74) Attorney, Agent, or Firm—Patrick M. Griffin

(57) ABSTRACT

A heat sink for cooling electrical or electronic devices comprises a base plate having a top surface and having a bottom surface for attaching to the electronic device. A folded fin formed from a strip of heat conducting material includes alternating planar portions and curved portions has one edge abutted to the top surface such that the curved portions extend upwardly from the top surface substantially at a right angle. Each planar portion has a plurality of louvers formed therein wherein the louvers are substantially parallel one to the other and perpendicular to the base plate.

13 Claims, 2 Drawing Sheets

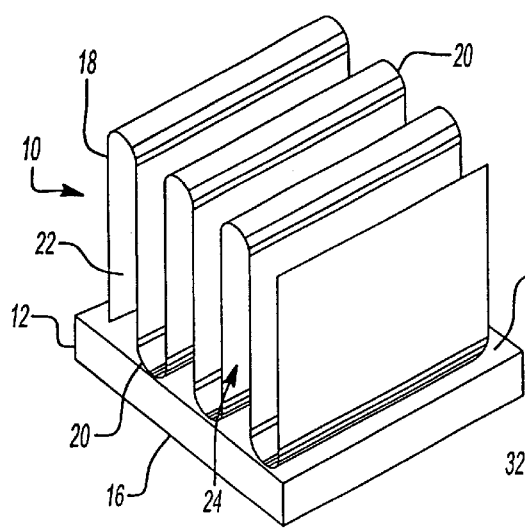
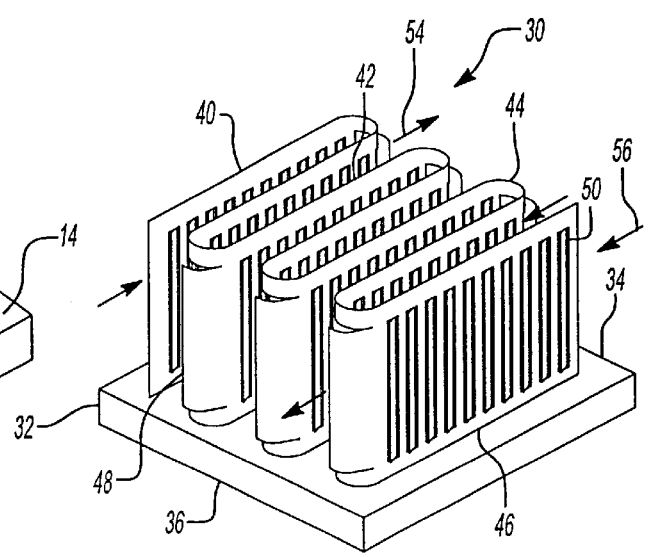
Fig-1 PRIOR ART
Fig-2
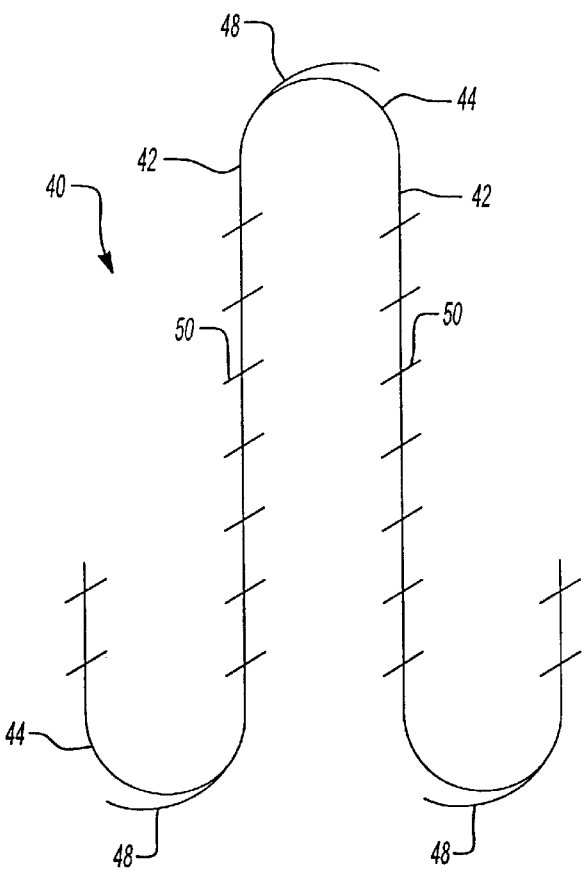
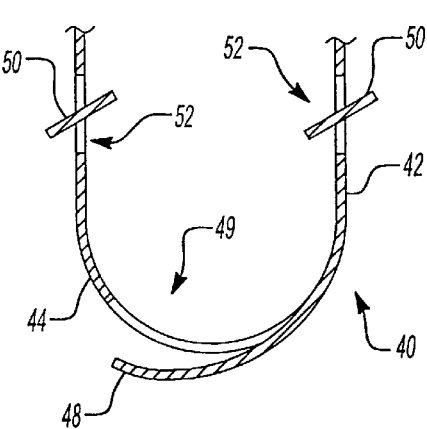
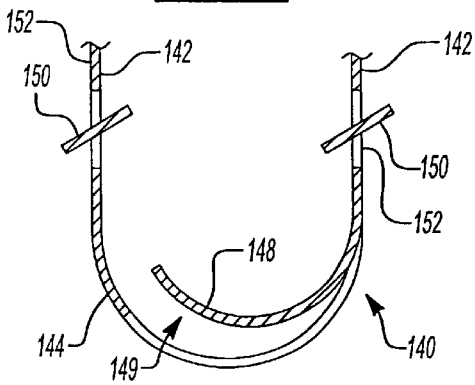
Fig-3
Fig-4
Fig-5

ADVANCED AIR COOLED HEAT SINK

TECHNICAL FIELD

The present invention is directed to heat sinks in general, and more particularly to heat sinks for use in dissipating waste heat generated by electrical or electronic components and assemblies.

BACKGROUND

High power electrical and electronic components continue to have an increasing demand for higher power dissipation within a relatively confined space. In order to provide for such higher power dissipation requirements while remaining suitably compact, several levels of thermal management are usually required at the device, sub-assembly and component level.

At the component level, various types of heat exchangers and heat sinks have been used that apply natural or forced convection or other cooling methods. One type of prior art heat sink for electrical or electronic components is illustrated in FIG. 1 and shown generally at 10. Heat sink 10 employs a base plate 12 that has a bottom surface 16 to which the electrical device is attached and a top surface 14 to which a folded fin 18 is attached. Folded fin 18 can be formed from a continuous strip of metal in an accordion-style such that there are alternating convoluted portions 20 and planar portions 22. The folded fin 18 is placed on top surface 14 of base plate 12 such that convoluted portions 20 on one side of fin 18 are abutted to top surface 14 of the base plate 12, and then typically affixed to the base plate by brazing, soldering, or other manner of affixing to enhance the heat flow from base plate 12 to folded fin 18. An electric fan is then placed in proximity to one side of the heat sink and air is either drawn or blown through the passages 24 formed by the fins and convolutions.

There are certain inefficiencies associated with this type of design, the primary inefficiency being that the airflow does not necessarily contact all flat surfaces of the folded fin. Thus a folded fin heat sink is desired that is easy to fabricate and assemble while also provided for improved airflow and thermal conductivity away from the electrical or electronic device being cool.

SUMMARY OF THE INVENTION

One aspect of the present invention is a heat sink for cooling electrical or electronic devices. The heat sink comprises a base plate having a top surface and having a bottom surface for attaching to the electronic device. A folded fin formed from a strip of heat conducting material comprising alternating planar portions and curved portions has one edge abutted to the top surface such that the curved portions extend upwardly from the top surface substantially at a right angle. Each planar portion has a plurality of louvers formed therein wherein the louvers are substantially parallel one to the other and perpendicular to the base plate.

Another aspect of the present invention is a method of fabricating a heat sink for electrical or electronic devices. The method comprising the steps of providing a base plate having a top surface and a bottom surface. A folded fin is formed from a strip of heat conductive material wherein the folded fin has a plurality of alternating curved portions and planar portions. A plurality of louvers is formed in each of the planar portions such that the louvers are aligned substantially parallel to the curved portions. One edge of the folded fin is affixed to the base plate such that the curved portions and planar portions are substantially perpendicular to the top surface of the base plate.

These and other advantages of the invention will be further understood and appreciated by those skilled in the art by reference to the following written specification, claims and appended drawings.

BRIEF DESCRIPTION OF THE DRAWINGS

FIG. 1 is a perspective view of a prior art heat sink, wherein the folds of the folded fin are abutted to a top surface of the base plate.

FIG. 2 is a perspective view of a heat sink embodying the present invention, wherein a louvered folded fin is mounted to a top surface of the base plate.

FIG. 3 is a plan view of the louvered fin shown in FIG. 2 illustrating the angulation of the louvers.

FIG. 4 is a partial cross-sectional view of the louver formed in the bend radius of the folded fin wherein the louver is bent away from the folded fin.

FIG. 5 is alternate embodiment of the heat sink of FIG. 4 wherein the louver in the bend radius is bent to the inside of the folded fin.

DETAILED DESCRIPTION OF THE PREFERRED EMBODIMENT

Figure 6:
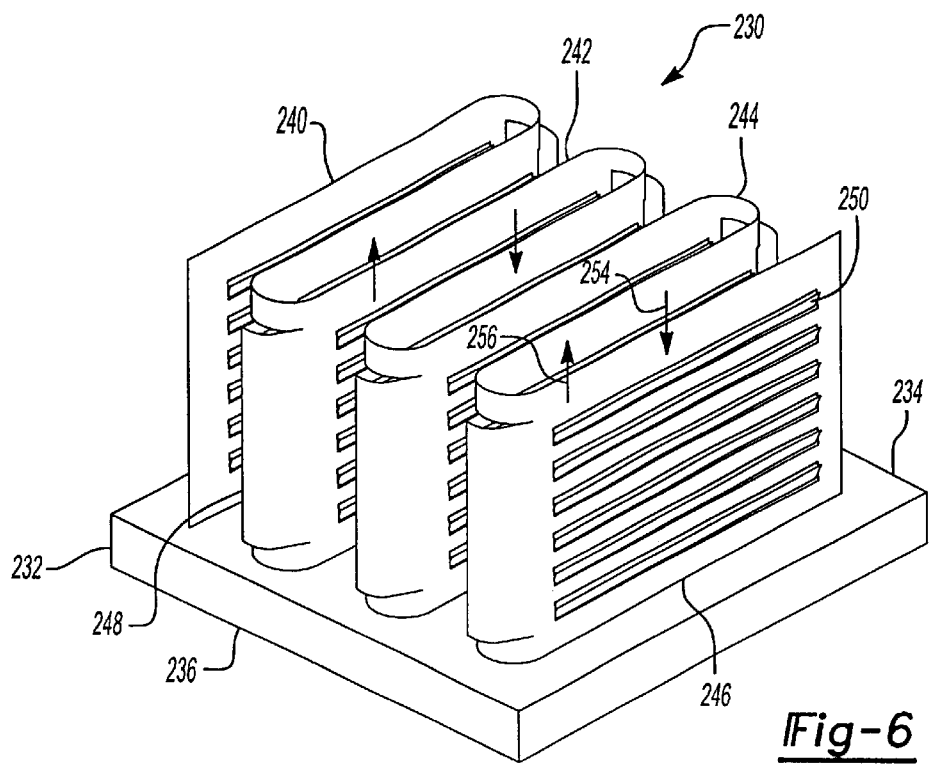
FIG. 6 is a perspective view of an alternate embodiment heat sink wherein the louvers are formed parallel with the base plate.

For purposes of description herein, the terms "upper", "lower", "left", "rear", "right", "front", "vertical", "horizontal", and derivatives thereof shall relate to the invention as oriented in FIG. 2. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Turning to the drawings, FIGS. 2–4 show a heat sink 30, which is one of the preferred embodiments of the present invention and illustrates its various components.

Heat sink 30 comprises a base plate 32 have a bottom surface 36 to which an electronic or electrical device (not shown) is to be affixed utilizing a 'thermal grease' to enhance thermal conductivity between the device and base plate 32. The manner and method of attaching an electrical device to the base plate 32 is well known in the art and therefore is not described in further detail herein. A top surface 34 of base plate 32 has mounted thereon a folded fin 40.

Folded fin 40 is formed from a strip of heat conductive material such as aluminum, copper, graphite, aluminum nitride ceramic, or other similar material. Folded fin 40 has a plurality of alternating planar portions 42 and curved portions 44 to form a substantially convoluted accordion-style fin. The folded fin 40 is placed on an edge 46 and abutted to top surface 34 such that the curved portions 44 are substantially perpendicular to and extend upwardly from top surface 34 of base plate 32. The edge 46 of folded fin 40 abutting top surface 34 can be affixed thereto by bonding metallurgically or with a thermally conductive adhesive to insure a heat conductive path from base plate 32 to folded fin 40.

As further illustrated in FIGS. 2–4, folded fin 40 includes a plurality of louvers 50 formed in each of planar portions 42. Cutting slits on each side of the louver 50 and then bending the louver 50 about a longitudinal axis forms louvers 50. Each louver 50 is bent out of the plane of planar portion 42 so that it is angular thereto, thus forming air passageways 52 on either side of each louver 50. In the preferred embodiment, louvers 50 are all substantially parallel one to the other, but those skilled in the art will readily recognize that the angular arrangement of louvers 50 can be varied to produce a variety of desired airflow patterns between and among the various planar portions 42.

Louvers 50 are oriented substantially parallel to the bend axis of curved portions 44 so that the longitudinal axis of each louver 50 is also substantially perpendicular to top surface 34 of base plate 32. Forming louvers 50 in such a manner does not remove any material from fin 40, which is critical to maximizing its heat transfer capabilities. Further, orienting louvers 50 such that their longitudinal direction is substantially perpendicular to top surface 34 facilitates the heat flow from base plate 32 towards the upper portion of folded fin 40. Louvers 50 are so oriented in anticipation of receiving an airflow thereacross according to airflow directional arrow 54 or 56. Thus, louvers 50 are oriented substantially transverse to airflow 54 or 56. The narrow width of louvers 50 facilitate the convection of heat from the louvers 50 to the air moving across the louvers.

As is evident by the orientation of the curved portions 44 being perpendicular to base plate 32, curved portions 44 can greatly hinder or block desired airflow in one direction between adjacent planar portions 42. Thus, as most clearly illustrated in FIG. 4, an end louver 48 is formed in each curved portion 44 of folded fin 40. End louver 48 is formed as a door-like flap by one longitudinal cut along curved portion 44 and adjoining transverse cuts at each end thereof. End louver 48 is then bent outwardly away from folded fin 40 to define an end passageway 49 thereby permitting a cross-flow of air between each adjacent pair of planar portions 42.

As illustrated in FIG. 5, an alternate embodiment folded fin 140 has a curved portion 144 connecting adjoining planar portions 142. Planar portions 142 each have a plurality of louvers 150 formed therein defining air passageways 152 as discussed above and has an end louver 148 formed at each curved portion 144. End louver 148 is also formed as a door-like flap by one longitudinal cut along curved portion 44 and adjoining transverse cuts at each end thereof. However in this embodiment, louver 148 is bent inwardly between adjacent planar portions 142 to open end passageway 149 to permit the cross-flow of air between each adjacent pair of planar portions 142.

In operation, as the electronic or electrical device generates heat, the heat is transferred to and dispersed throughout the various regions of base plate 32. As a result of the adhesive or metallurgical bonding of folded fin 40 to base plate 32, the heat is also transferred to the areas of planar portions 42 and curved portions 44 immediately adjacent to base plate 32. The heat is conducted upwardly away from base plate 32 by folded fin 40 along each individual louver 50. Air is then caused to pass between adjacent planar portions 42 and through end passageways 49 in either direction as indicated by airflow direction 54, 56.

As air passes between adjacent planar portions 42, a leading edge of each louver 50 causes a portion of the airflow to be directed across the width of each louver 50 and into the adjoining space between planar portions 42. Since the width of each louver 50 is relatively small, only a small thermal boundary layer forms therealong and upon passing over a trailing edge of the louver 50, the airflow becomes turbulent thereby causing a greater volume of air to come in contact with louvers 50. The combination of relatively long and narrow louvers 50 substantially transverse to airflow 54 or 56 in combination with the formation of end louvers 48 defining end passageways 49 to facilitate the flow of air between adjacent planar portions 42 thus enhances the convection of heat from louvers 50 to the airflow stream thereby transferring heat away from the electronic device desiring to be cooled.

Referring now to FIG. 6, an alternate embodiment heat sink 230 is illustrated wherein like elements to heat sink 30 as described above are identified with like numerals preceded by the numeral '2'. In this embodiment, louvers 250 in planar portions 242 are oriented substantially parallel to top surface 234 of base plate 232. Heat sink 230 including louvers 250 oriented in such a manner is in contemplation of a primary airflow therethrough flowing normal to top surface 234, and thus maintaining the transverse relationship of louvers 250 to the airflow direction 254 or 256.

Figure 7:
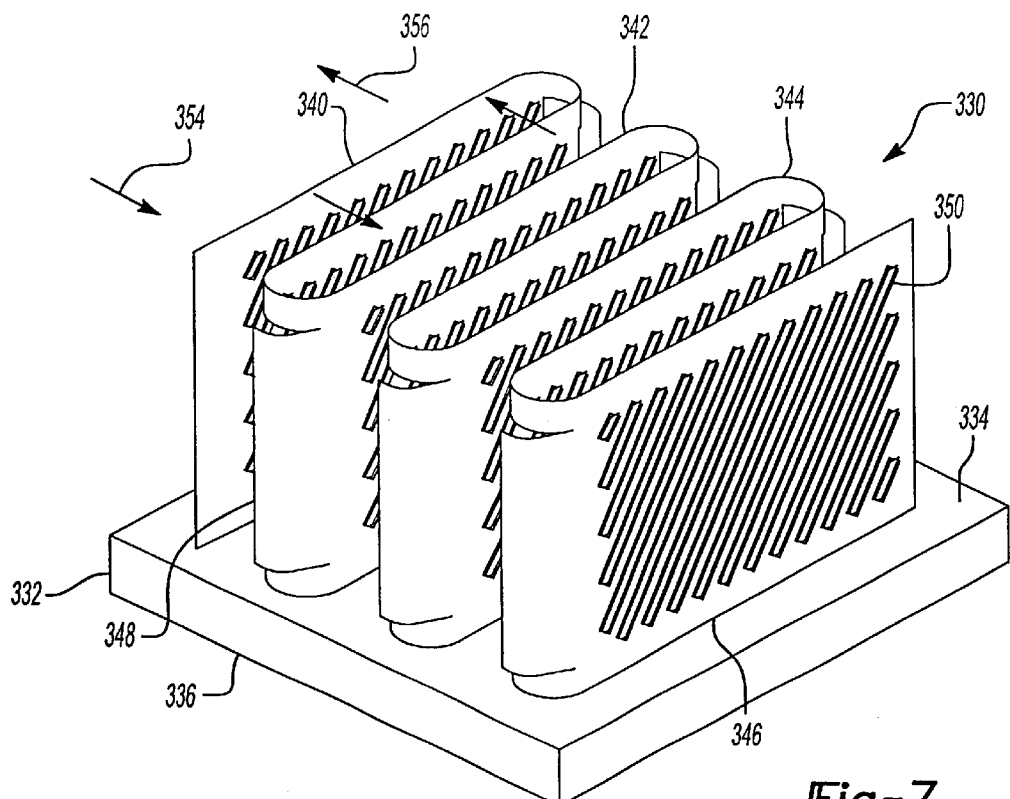
FIG. 7 is a perspective view of an alternate embodiment heat sink wherein the louvers are angularly oriented with respect to the base plate.

FIG. 7 illustrates yet another embodiment heat sink 330 wherein like elements to heat sink 30 as described above are identified with like numerals preceded by the numeral '3'. In this embodiment, louvers 350 in planar portions 342 are angularly oriented with respect to top surface 334 of base plate 332. Heat sink 330 including angularly oriented louvers 350 contemplates an angular airflow 354 such that louvers 350 are substantially transverse to airflow 354 or 356.

In the foregoing description those skilled in the art will readily appreciate that modifications may be made to the invention without departing from the concepts disclosed herein. Such modifications are to be considered as included in the following claims, unless these claims expressly state otherwise.

We claim:

1. A heat sink for cooling electrical or electronic devices, said heat sink comprising:
   a base plate having a top surface and having a bottom surface for attaching to the electronic device; and
   a folded fin formed from a strip of heat conducting material, said folded fin further comprising alternating planar portions and curved portions, wherein said folded fin has one edge abutted to said top surface such that said curved portions extend upwardly from said top surface substantially at a right angle, each of said planar portions having a plurality of louvers formed therein with said louvers being substantially parallel to one another and at least one of said curved portions including an end louver formed therein with said end louver formed as a door-like flap for defining an end passageway therethrough.

2. The heat sink according to claim 1 wherein said end louver is folded to extend exteriorly of said curved portion for defining said end passageway therethrough.

3. The heat sink according to claim 2 wherein said exteriorly folded end louver is parallel to said curved portion.

4. The heat sink according to claim 1 wherein said end louver is folded to extend interiorly of said curved portion for defining said end passageway therethrough.

5. The heat sink according to claim 4 wherein said interiorly folded end louver is parallel to said curved portion.

6. The heat sink according to claim 1 wherein said louvers in said planar portions are angled at other than a right angle with respect to a plane of said planar portions.

7. The heat sink according to claim 1 wherein said planar portions are affixed to said base plate by metallurgically bonding.

8. The heat sink according to claim 1 wherein said planar portions are affixed to said base plate by adhesively bonding.

9. The heat sink according to claim 1 wherein said louvers in said planar portions are oriented substantially parallel to said base plate.

10. The heat sink according to claim 1 wherein said louvers in said planar portions are angularly oriented with respect to said base plate.

11. The heat sink according to claim 1 wherein said louvers in said planar portions are oriented substantially perpendicular to said base plate.

12. The heat sink according to claim 11 wherein each louver of said plurality of louvers has a longitudinal length substantially parallel to said curved portions and greater than a width of said louver.

13. The heat sink according to claim 12 wherein each of said curved portions includes an end louver.

* * * * *